(12) United States Patent
Washida et al.

(10) Patent No.: US 10,971,456 B2
(45) Date of Patent: Apr. 6, 2021

(54) ELECTRONIC COMPONENT

(71) Applicant: Murata Manufacturing Co., Ltd., Nagaokakyo (JP)

(72) Inventors: Ryosuke Washida, Nagaokakyo (JP); Jyunichi Nanjyo, Nagaokakyo (JP); Narimichi Makino, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 53 days.

(21) Appl. No.: 16/575,563

(22) Filed: Sep. 19, 2019

(65) Prior Publication Data

US 2020/0013729 A1    Jan. 9, 2020

Related U.S. Application Data

(63) Continuation of application No. PCT/JP2018/017804, filed on May 8, 2018.

(30) Foreign Application Priority Data

Jun. 1, 2017    (JP) .............................. JP2017-108972

(51) Int. Cl.
*H01L 23/552*    (2006.01)
*H01F 27/28*    (2006.01)
(Continued)

(52) U.S. Cl.
CPC ....... *H01L 23/552* (2013.01); *H01F 27/2804* (2013.01); *H01L 23/3121* (2013.01);
(Continued)

(58) Field of Classification Search
CPC ............... H01L 23/552; H01L 23/3121; H01L 23/49811; H01L 23/49822; H01L 23/645;
(Continued)

(56) References Cited

U.S. PATENT DOCUMENTS 7,351,674 B2 * 4/2008 Mori ...................... C03C 3/066
428/210
2009/0305467 A1 * 12/2009 Goto ..................... H01L 21/568
438/125

(Continued)

FOREIGN PATENT DOCUMENTS

JP    09-181443 A    7/1997
JP    2010-093112 A    4/2010
(Continued)

OTHER PUBLICATIONS

Official Communication issued in International Patent Application No. PCT/JP2018/017804, dated Jul. 31, 2018.

*Primary Examiner* — Syed I Gheyas
(74) *Attorney, Agent, or Firm* — Keating & Bennett, LLP

(57) ABSTRACT

An electronic component includes a multilayer body including a first insulator and a second insulator having a higher resistivity than the first insulator, metal conductors each positioned between the first insulator and the second insulator and including a predetermined end surface positioned at least near an end surface of the multilayer body, plating films each provided on the predetermined end surface of the metal conductor in a state extending out in a direction covering an end surface of the first insulator by a larger distance than in a direction covering an end surface of the second insulator, and an outer conductor provided on the outer sides of the plating films and electrically connected to the metal conductor through the plating films.

20 Claims, 5 Drawing Sheets

(51) Int. Cl.
  *H01L 23/31* (2006.01)
  *H01L 23/498* (2006.01)
  *H01L 23/64* (2006.01)
  *H01L 25/16* (2006.01)

(52) U.S. Cl.
  CPC .. *H01L 23/49811* (2013.01); *H01L 23/49822* (2013.01); *H01L 23/645* (2013.01); *H01L 25/16* (2013.01); *H01F 2027/2809* (2013.01)

(58) Field of Classification Search
  CPC ........... H01L 25/16; H01L 2224/16227; H01L 2924/19105; H01L 2924/15313; H01L 2924/3025; H01L 2224/97; H01F 27/2804; H01F 2027/2809; H01F 17/04; H01F 27/40; H01F 2017/008; H01F 17/0013
  See application file for complete search history.

(56) References Cited

U.S. PATENT DOCUMENTS

| | | |
|---|---|---|
| 2010/0091426 A1 | 4/2010 | Motoki et al. |
| 2011/0298111 A1* | 12/2011 | Kim .................. H01L 23/13 257/660 |
| 2012/0286415 A1* | 11/2012 | Sakai .................. H01L 21/78 257/734 |
| 2015/0171019 A1* | 6/2015 | Shibuya ............. H01L 23/3121 257/659 |
| 2017/0323838 A1 | 11/2017 | Otsubo et al. |

FOREIGN PATENT DOCUMENTS

| | | |
|---|---|---|
| WO | 2016/121491 A1 | 8/2016 |
| WO | 2017/006784 A1 | 1/2017 |

* cited by examiner

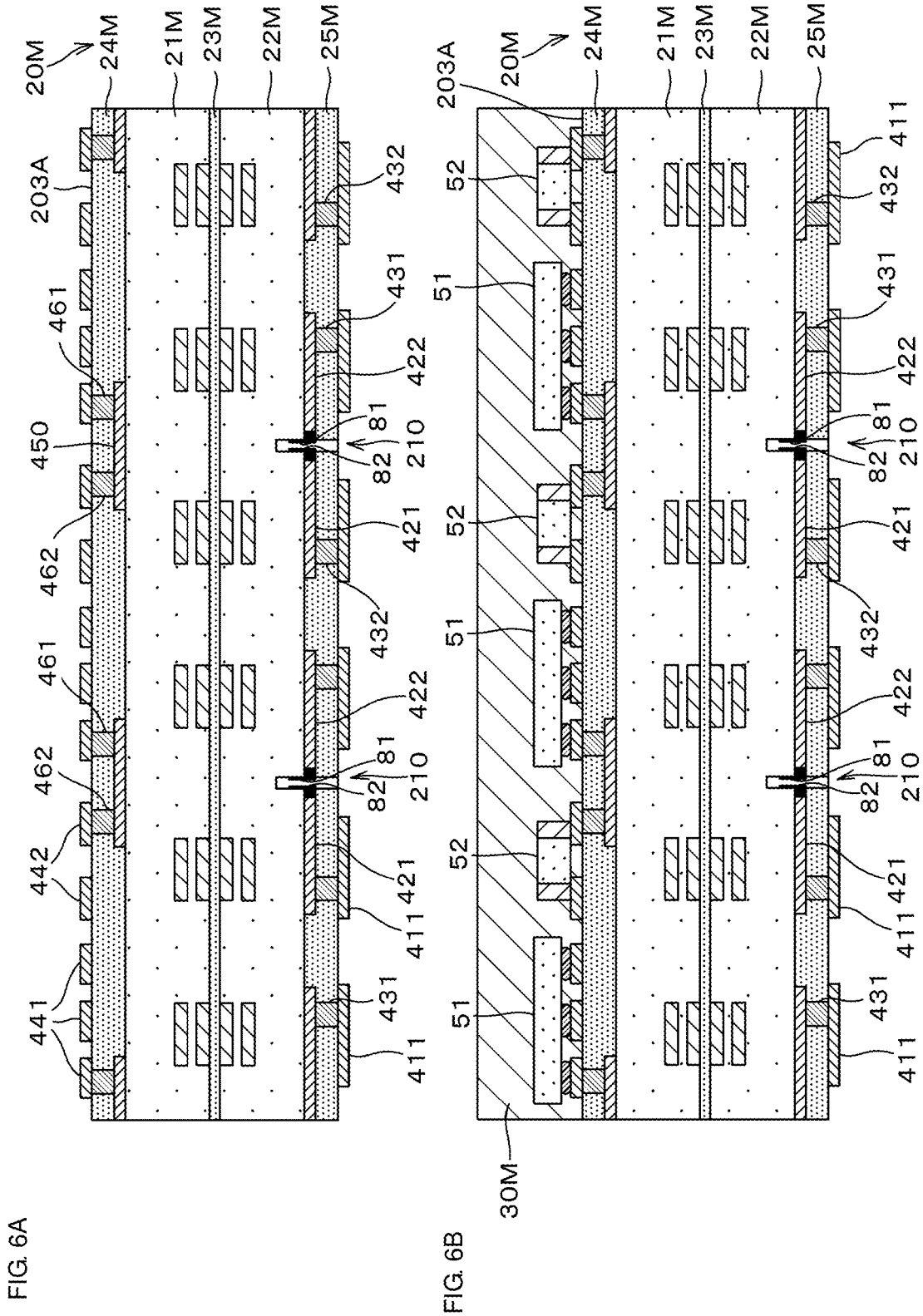

ELECTRONIC COMPONENT

CROSS REFERENCE TO RELATED APPLICATIONS

This application claims the benefit of priority to Japanese Patent Application No. 2017-108972 filed on Jun. 1, 2017 and is a Continuation Application of PCT Application No. PCT/JP2018/017804 filed on May 8, 2018. The entire contents of each application are hereby incorporated herein by reference.

BACKGROUND OF THE INVENTION

1. Field of the Invention

The present invention relates to an electronic component, and more particularly, to an electronic component including a structure in which a metallic conductor is disposed between insulators.

2. Description of the Related Art

There is known an electronic component having a structure in which a metallic conductor is sandwiched between insulators.

Japanese Unexamined Patent Application Publication No. 2010-93112 discloses, as one example of this type of electronic component, an electronic component in which a metal film containing, as a main ingredient, at least one selected from among Pd, Au, Pt and Ag is coated on an end surface of a metal conductor containing, as a main ingredient, a non-precious metal, and in which a plating film is formed on the metal film. According to the disclosed electronic component, because the end surface of the metal conductor is coated with a precious metal, the plating film can be uniformly formed on the end surface of the metal conductor.

However, the electronic component disclosed in Japanese Unexamined Patent Application Publication No. 2010-93112 has the following problem. Because the insulators disposed in a sandwiching relationship to the metal conductor are made of the same material, the plating film formed on the end surface of the metal conductor has a shape bulging outward with a position of the metal film being a center, as illustrated in FIG. 4 of Japanese Unexamined Patent Application Publication No. 2010-93112, and it is difficult to form the plating film spreading flat and having a large planar area. Therefore, when an outer conductor electrically connected to the metal conductor through the plating film is disposed on the outer side of the plating film, a connection area between the outer conductor and the plating film cannot be obtained as a sufficiently large area, and there is room for improvement in reliability of connection between the metal conductor and the outer conductor.

SUMMARY OF THE INVENTION

Preferred embodiments of the present invention provide electronic components that each increase a connection area between an outer conductor and a plating film, and which improve reliability of connection between a metal conductor and the outer conductor.

A preferred embodiment of the present invention provides an electronic component that includes a multilayer body including a first insulator and a second insulator having a higher resistivity than the first insulator, a metal conductor positioned between the first insulator and the second insulator and including a predetermined end surface positioned at least near an end surface of the multilayer body, a plating film provided on the predetermined end surface of the metal conductor in a state extending out in a direction covering an end surface of the first insulator by a larger distance than in a direction covering an end surface of the second insulator, and an outer conductor provided on an outer side of the plating film and electrically connected to the metal conductor through the plating film.

The predetermined end surface of the metal conductor may be positioned on the inner side than the end surface of the multilayer body.

The first insulator may be a magnetic body and the second insulator may be a nonmagnetic body.

A coil may be provided inside the first insulator, and the outer conductor may define a shield.

The metal conductor may be electrically connected to a ground.

With electronic components according to preferred embodiments of the present invention, since the plating film provided on the end surface of the metal conductor has a shape extending out in the direction covering the end surface of the first insulator, which has a lower resistivity than the second insulator, by a larger distance than in the direction covering the end surface of the second insulator, a connection area between the plating film and the outer conductor is increased in comparison with the case in which the plating film is provided in a shape bulging outward with the end surface of the metal conductor being a center. As a result, reliability of connection between the metal conductor and the outer conductor is able to be improved.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 6A and 6B are explanatory views showing the manufacturing method of the ferrite substrate module.

DETAILED DESCRIPTION OF THE PREFERRED EMBODIMENTS

The features of the present invention will be described in more detail below in connection with preferred embodiments of the present invention and with reference to the accompanying drawings.

In the following, an electronic component according to preferred embodiments of the present invention is described, taking a ferrite substrate module as an example.

Figure 1:
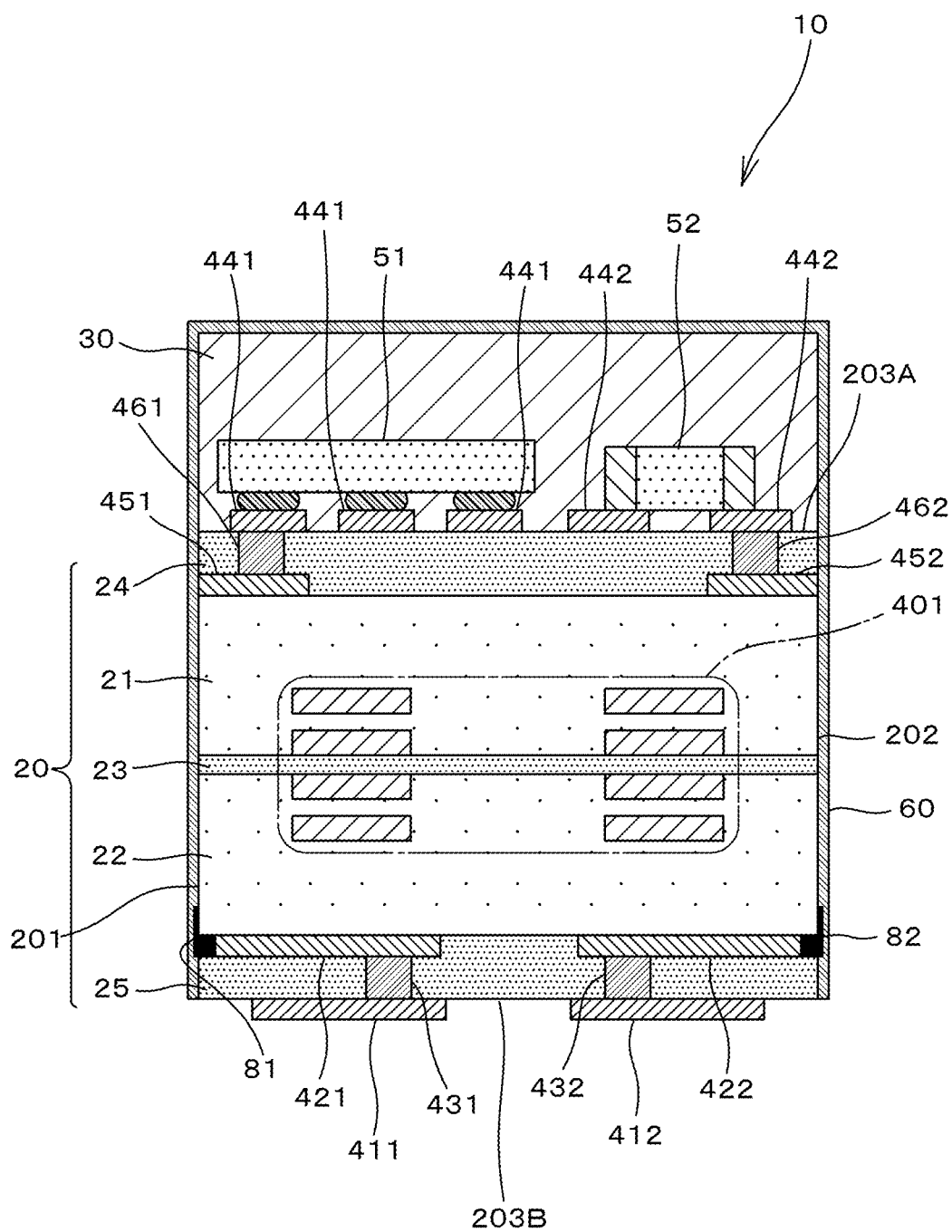
FIG. 1 is a sectional view schematically illustrating a structure of a ferrite substrate module that is a typical one of an electronic component according to a preferred embodiment of the present invention.
Figure 2:
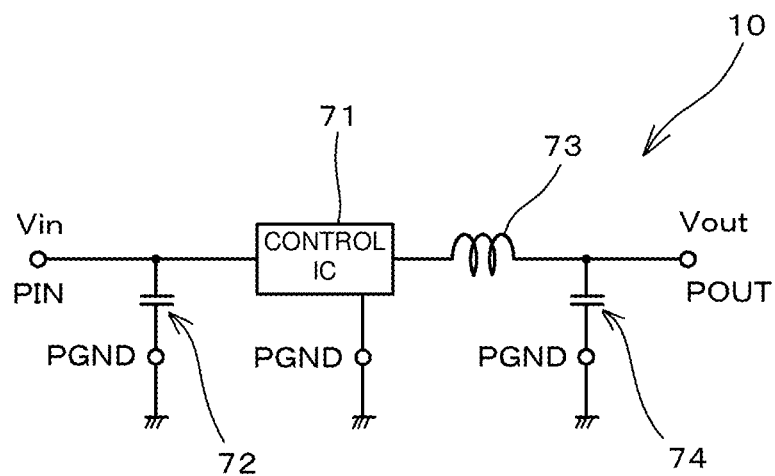
FIG. 2 is a schematic circuit diagram illustrating an example of a power supply circuit to which the ferrite substrate module, i.e., an electronic component according to a preferred embodiment of the present invention, is applied.

FIG. 1 is a sectional view schematically illustrating a structure of a ferrite substrate module 10 according to a preferred embodiment of the present invention. FIG. 2 is a schematic circuit diagram illustrating an example of a power supply circuit to which the ferrite substrate module 10, i.e., an electronic component according to the present preferred embodiment of the present invention is preferably applied.

As illustrated in FIG. 1, the ferrite substrate module 10 preferably includes a ferrite substrate 20, a sealing resin 30, a first mounted electronic component 51, a second mounted electronic component 52, and an outer conductor 60.

The ferrite substrate 20 has a rectangular or substantially rectangular parallelepiped shape. More specifically, the ferrite substrate 20 preferably includes at least a first principal surface 203A and a second principal surface 203B opposing to each other, and a first lateral surface 201 and a second lateral surface 202 each interconnecting the first principal surface 203A and the second principal surface 203B.

The ferrite substrate 20 defined by a multilayer body preferably includes a first magnetic layer 21, a second magnetic layer 22, a first nonmagnetic layer 24, a second nonmagnetic layer 25, and a third nonmagnetic layer 23. The first magnetic layer 21, the second magnetic layer 22, the first nonmagnetic layer 24, the second nonmagnetic layer 25, and the third nonmagnetic layer 23 are each preferably a ceramic insulator layer. Furthermore, the first magnetic layer 21 and the second magnetic layer 22 are each defined by laminating a plurality of ceramic insulator layers. The second magnetic layer 22 preferably corresponds to a first insulator, and the second nonmagnetic layer 25 preferably corresponds to a second insulator.

The third nonmagnetic layer 23 is disposed between the first magnetic layer 21 and the second magnetic layer 22. The third nonmagnetic layer 23 may be omitted. When the third nonmagnetic layer 23 is omitted, a magnetic layer including the first magnetic layer 21 and the second magnetic layer 22 corresponds to the first insulator in the present invention. It is, however, to be noted that DC superposition characteristics of a later-described coil 401 are able to be improved with the provision of the third nonmagnetic layer 23.

The first nonmagnetic layer 24 is in contact with one surface of the first magnetic layer 21, the one surface being positioned on the opposite side to the other surface in contact with the third nonmagnetic layer 23.

The second nonmagnetic layer 25 is in contact with one surface of the second magnetic layer 22, the one surface being positioned on the opposite side to the other surface in contact with the third nonmagnetic layer 23.

Thus, the first nonmagnetic layer 24, the first magnetic layer 21, the third nonmagnetic layer 23, the second magnetic layer 22, and the second nonmagnetic layer 25 are successively laminated along a thickness direction.

The coil 401 is provided in a portion where the first magnetic layer 21, the third nonmagnetic layer 23, and the second magnetic layer 22 are laminated.

The coil 401 is preferably defined by a spiral conductor including an opening provided at a center of the ferrite substrate 20 when viewed in plan and having an axial direction aligned with the thickness direction. To obtain such a structure, the coil 401 includes a plurality of coil conductors and a plurality of interlayer connection conductors.

Each of the coil conductors preferably has a winding shape, i.e., an annular shape with a circumference partially cut off. The coil conductors are embedded within the first magnetic layer 21 and the second magnetic layer 22 of the ferrite substrate 20 at different positions in the thickness direction. The coil conductors are connected by the interlayer connection conductors, which are provided in the first magnetic layer 21, the second magnetic layer 22, and the third nonmagnetic layer 23, thus defining one conductor. An end portion of the connected coil conductor is electrically connected to a mounted electronic component (e.g., a control IC), which is mounted on the first nonmagnetic layer 24, through the interlayer connection conductor provided in the first nonmagnetic layer 24.

A first component-mounting land conductor 441, a second component-mounting land conductor 442, a first wiring conductor 451, a second wiring conductor 452, a first interlayer connection conductor 461, and a second interlayer connection conductor 462 are provided on and/or in the first nonmagnetic layer 24.

The first component-mounting land conductor 441 and the second component-mounting land conductor 442 are provided on the first principal surface 203A of the ferrite substrate 20, i.e., one surface of the first nonmagnetic layer 24, the one surface being positioned on the opposite side to the other surface in contact with the first magnetic layer 21. The first mounted electronic component 51 is mounted to the first component-mounting land conductor 441. The second mounted electronic component 52 is mounted to the second component-mounting land conductor 442.

The first wiring conductor 451 is provided at an interface between the first nonmagnetic layer 24 and the first magnetic layer 21. A portion of the first wiring conductor 451 near one end thereof is electrically connected to the first component-mounting land conductor 441 through the first interlayer connection conductor 461. The other end of the first wiring conductor 451 is connected to the outer conductor 60 described later.

The second wiring conductor 452 is provided at the interface between the first nonmagnetic layer 24 and the first magnetic layer 21. A portion of the second wiring conductor 452 near one end thereof is electrically connected to the second component-mounting land conductor 442 through the second interlayer connection conductor 462. The other end of the second wiring conductor 452 is connected to the outer conductor 60 described later.

A first terminal conductor 411, a second terminal conductor 412, a third wiring conductor 421, a fourth wiring conductor 422, a third interlayer connection conductor 431, and a fourth interlayer connection conductor 432 are provided on and/or in the second nonmagnetic layer 25.

The first terminal conductor 411 and the second terminal conductor 412 are provided on one surface of the second nonmagnetic layer 25, the one surface being positioned on the opposite side to the other surface in contact with the second magnetic layer 22. The first terminal conductor 411 and the second terminal conductor 412 are terminal conductors that connect to a reference potential, for example, terminal conductors that connect to a ground (earth).

The third wiring conductor 421 corresponds to a metal conductor. The third wiring conductor 421 is provided at an interface between the second nonmagnetic layer 25 and the second magnetic layer 22. Thus, the third wiring conductor 421 is disposed between the second nonmagnetic layer 25 and the second magnetic layer 22. A portion of the third wiring conductor 421 near one end thereof is electrically connected to the first terminal conductor 411 through the third interlayer connection conductor 431.

An end surface of the third wiring conductor 421 on the other end side is positioned near the first lateral surface 201 of the ferrite substrate 20. A plating film 81 is provided on the end surface of the third wiring conductor 421 on the other end side. Details of the plating film 81 will be described later.

The fourth wiring conductor 422 corresponds to the metal conductor. The fourth wiring conductor 422 is provided at the interface between the second nonmagnetic layer 25 and the second magnetic layer 22. Thus, the fourth wiring conductor 422 is disposed between the second nonmagnetic layer 25 and the second magnetic layer 22. A portion of the fourth wiring conductor 422 near one end thereof is electrically connected to the second terminal conductor 412 through the fourth interlayer connection conductor 432.

An end surface of the fourth wiring conductor 422 on the other end side is positioned near the second lateral surface 202 of the ferrite substrate 20. A plating film 82 is provided on the end surface of the fourth wiring conductor 422 on the other end side. Details of the plating film 82 will be described later with reference to FIG. 3.

The sealing resin 30 covers the first principal surface 203A of the ferrite substrate 20, the first mounted electronic component 51, and the second mounted electronic component 52.

The outer conductor 60 defining and functioning as a shield covers a surface of the sealing resin 30, and the first lateral surface 201 and the second lateral surface 202 of the ferrite substrate 20. The outer conductor 60 is preferably defined by three layers of stainless steel, copper, and stainless steel, for example.

The first wiring conductor 451 and the second wiring conductor 452 are electrically connected to the outer conductor 60. The third wiring conductor 421 is electrically connected to the outer conductor 60 through the plating film 81, and the fourth wiring conductor 422 is electrically connected to the outer conductor 60 through the plating film 82.

When the first terminal conductor 411 and the second terminal conductor 412 are the terminal conductors that connect to the ground (earth), the third wiring conductor 421 and the fourth wiring conductor 422 are also electrically connected to the ground. Accordingly, the outer conductor 60 is further electrically connected to the ground.

Here, the first wiring conductor 451, the second wiring conductor 452, the third wiring conductor 421, and the fourth wiring conductor 422 are each preferably made from a material with Ag, for example, as a main ingredient. With this feature, conductivity of the first wiring conductor 451, the second wiring conductor 452, the third wiring conductor 421, and the fourth wiring conductor 422 is able to be increased, and higher stability of the grounding is able to be ensured.

It is to be noted that the main ingredient of the third wiring conductor 421 and the fourth wiring conductor 422, each representing the metal conductor, is not limited to Ag, and may instead be any other desirable conductive material.

The ferrite substrate module 10 having the above-described structure is preferably applied to a circuit such as illustrated in FIG. 2. As illustrated in FIG. 2, the ferrite substrate module 10 includes an input terminal PIN, an output terminal POUT, a ground terminal PGND, a control IC 71, an input capacitor 72, an inductor (choke coil) 73, and an output capacitor 74.

An input terminal of the control IC 71 is connected to the input terminal PIN. The input capacitor 72 is connected between the input terminal PIN and the ground terminal PGND. One end of the inductor 73 is connected to an output terminal of the control IC 71, and the other end of the inductor 73 is connected to the output terminal POUT. The output capacitor 74 is connected between the output terminal POUT and the ground terminal PGND. The ground terminal PGND is connected to the external ground (earth potential), i.e., the reference potential.

With the above-described configuration, the ferrite substrate module 10 receives an input voltage Vin applied to the input terminal PIN and outputs it as an output voltage Vout from the output terminal POUT in accordance with switching control by the control IC 71. In other words, the ferrite substrate module 10 functions as a step-down DCDC converter.

The control IC 71 in FIG. 2 is preferably implemented by the first mounted electronic component 51 in FIG. 1, the input capacitor 72 and the output capacitor 74 in FIG. 2 are each preferably implemented with the second mounted electronic component 52 in FIG. 1, and the inductor 73 in FIG. 2 is preferably implemented with the coil 401 in FIG. 1. The DC-DC converter in which noise is reduced or prevented is able to be obtained with improvement in stability of connection between the outer conductor 60 shielding the above-mentioned elements and the ground terminal PGND.

Figure 3:
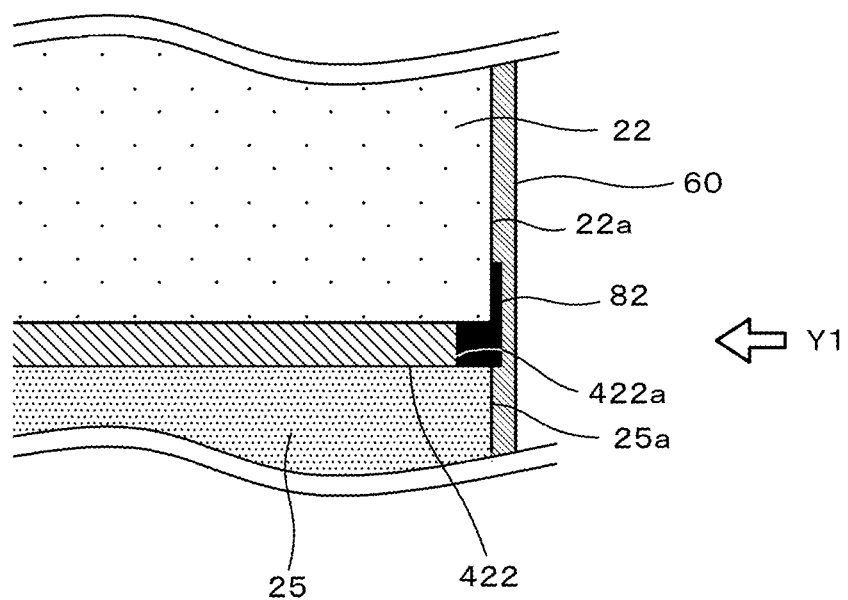
FIG. 3 is an enlarged view of an outer end surface of a fourth wiring conductor and its surroundings according to a preferred embodiment of the present invention.

FIG. 3 is an enlarged view of an outer end surface of the fourth wiring conductor 422 and its surroundings. The plating film 82 provided on the outer end surface of the fourth wiring conductor 422 will be described below, but the plating film 81 provided on an outer end surface of the third wiring conductor 421 also has a similar structure.

The outer end surface 422a of the fourth wiring conductor 422 is positioned further inward than an end surface 22a of the second magnetic layer 22 and an end surface 25a of the second nonmagnetic layer 25. The plating film 82 is provided on the outer end surface 422a of the fourth wiring conductor 422.

Figure 4:
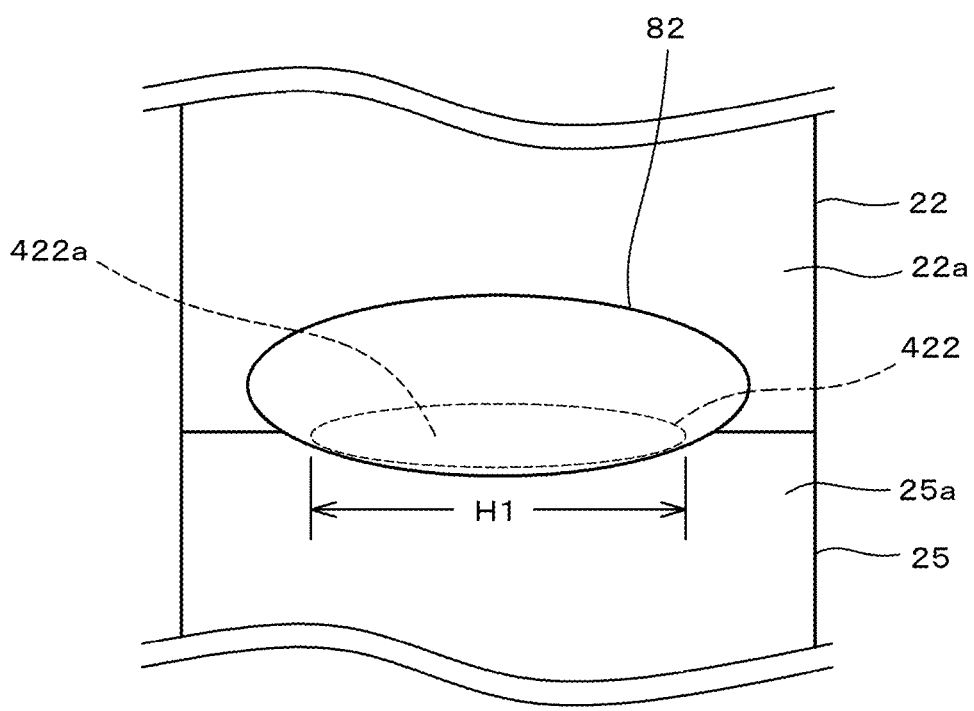
FIG. 4 illustrates a region including the outer end surface of the fourth wiring conductor and the surroundings when viewed from a direction denoted by an arrow Y1 in FIG. 3.

The plating film 82 is provided in a state extending out in a direction covering the end surface 22a of the second magnetic layer 22 by a larger distance than in a direction covering the end surface 25a of the second nonmagnetic layer 25. FIG. 4 illustrates a region including the outer end surface 422a of the fourth wiring conductor 422 and the surroundings when viewed from a direction denoted by an arrow Y1 in FIG. 3.

The plating film 82 may preferably be an electrolytic plating film or an electroless plating film, for example. Metal species used for the plating film 82 are not limited to particular ones. For example, Ni+Au and Ni+Sn may be used.

A resistivity of the second magnetic layer 22 is lower than that of the second nonmagnetic layer 25. In other words, the second magnetic layer 22 has a relatively high affinity to a conductor. The plating film is formed on the end surface 422a of the fourth wiring conductor 422 in a process of manufacturing the ferrite substrate module 10, therefore, plating deposition progresses toward the second magnetic layer 22 having the lower resistivity. Accordingly, the plating film 82 on the end surface 422a of the fourth wiring conductor 422 has a shape extending out in the direction covering the end surface 22a of the second magnetic layer 22 by a larger distance than in the direction covering the end surface 25a of the second nonmagnetic layer 25. Stated in another way, a total area where the plating film 82 covers the end surface 22a of the second magnetic layer 22 is larger than an area where the plating film 82 covers the end surface 25a of the second nonmagnetic layer 25.

As described above, the plating film 82 is provided over a region having a larger size than a thickness of the fourth wiring conductor 422 in a lamination direction. More specifically, as illustrated in FIG. 4, the plating film 82 extends over the end surface 22a of the second magnetic layer 22 through a length in excess of the thickness of the fourth wiring conductor 422. Thus, in comparison with the case in which a plating film is provided on the end surface 422a of the fourth magnetic layer 422 in a shape projecting straight outward and not spreading outward along the lamination direction, a connection area between the plating film 82 and the outer conductor 60 is increased, and reliability of electrical connection between the fourth wiring conductor 422 and the outer conductor 60 through the plating film 82 is improved. As a result, the grounding of the outer conductor 60 is able to be ensured with higher stability, and radio frequency noise radiated from the ferrite substrate module 10 is able to be effectively reduced.

Furthermore, since the plating film 82 provided on the end surface 422a of the fourth magnetic layer 422 has the shape extending out in the direction covering the end surface 22a of the second magnetic layer 22 instead of the shape projecting straight outward, the outer conductor 60 is able to easily be formed on the outer side of the plating film 82 in the process of manufacturing the ferrite substrate module 10.

In the preferred embodiment described above, the end surface 422a of the fourth wiring conductor 422 is positioned on the inner side than the end surface 22a of the second magnetic layer 22 and the end surface 25a of the second nonmagnetic layer 25. Therefore, as illustrated in FIG. 3, the plating film 82 is provided in a region on the outer side than the end surface 422a of the fourth wiring conductor 422 and between the second magnetic layer 22 and the second nonmagnetic layer 25. Accordingly, a contact area between the plating film 82 and each of the second magnetic layer 22 and the second nonmagnetic layer 25, both being insulator layers, is increased. As a result, fixing strength between the plating film 82 and each of the second magnetic layer 22 and the second nonmagnetic layer 25 is increased.

It is to be noted that a width H1 of the fourth wiring conductor 422 perpendicular to the extending direction of the fourth wiring conductor 422, illustrated in FIG. 4, can be set to any desired length.

The above-described ferrite substrate module 10 can be manufactured by the following non-limiting example of a method according to a preferred embodiment of the present invention.

Figure 5A:
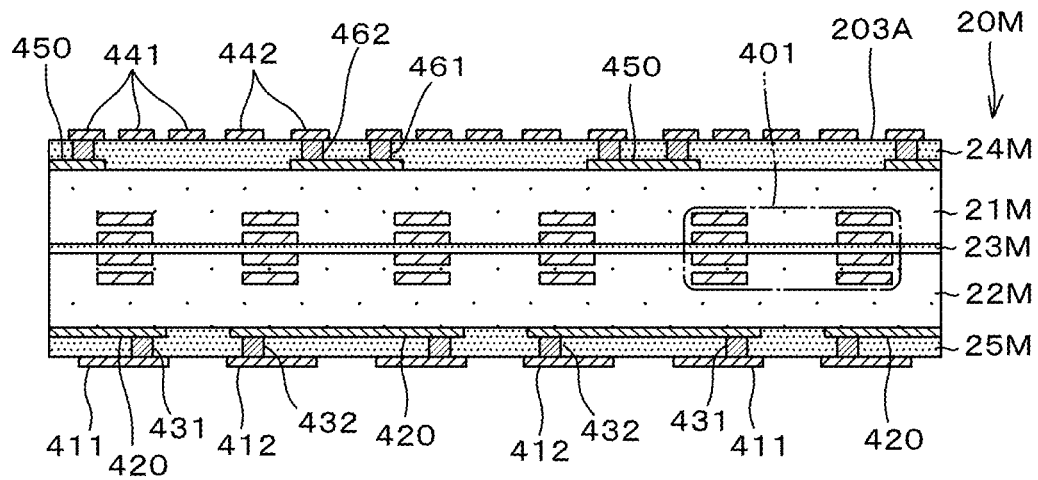
FIGS. 5A to 5C are explanatory views showing a manufacturing method of the ferrite substrate module according to a preferred embodiment of the present invention.

First, as illustrated in FIG. 5A, conductor patterns are formed on a plurality of magnetic sheets defining magnetic layers 21M and 22M, and on a plurality of nonmagnetic sheets defining nonmagnetic layers 24M and 25M. The magnetic sheets defining the magnetic layers 21M and 22M and the nonmagnetic sheets defining the nonmagnetic layers 24M and 25M are mother sheets each of which has a size enabling a plurality of the ferrite substrates 20 to be formed at a time.

As the conductor patterns, the coil conductors and the interlayer connection conductors, which define the coil 401, are formed on the magnetic sheets defining the magnetic layers 21M and 22M. Furthermore, the first component-mounting land conductor 441, the second component-mounting land conductor 442, a wiring conductor 450, the first interlayer connection conductor 461, and the second interlayer connection conductor 462 are preferably formed on and/or in the nonmagnetic sheets defining the nonmagnetic layer 24M. In addition, the first terminal conductor 411, the second terminal conductor 412, a wiring conductor 420, the third interlayer connection conductor 431, and the fourth interlayer connection conductor 432 are preferably formed on and/or in the nonmagnetic sheets constituting the nonmagnetic layer 25M.

Each of the wiring conductors 420 and 450 preferably has a shape straddling over a plurality of element section. Here, the term "element section" denotes a portion that finally becomes one ferrite substrate module 10 (one ferrite substrate 20).

Then, a mother multilayer body 20M is formed by laminating the magnetic sheets defining the magnetic layers 21M and 22M, the nonmagnetic sheets defining the nonmagnetic layers 24M and 25M, and nonmagnetic sheets defining a nonmagnetic layer 23M.

Figure 5B:
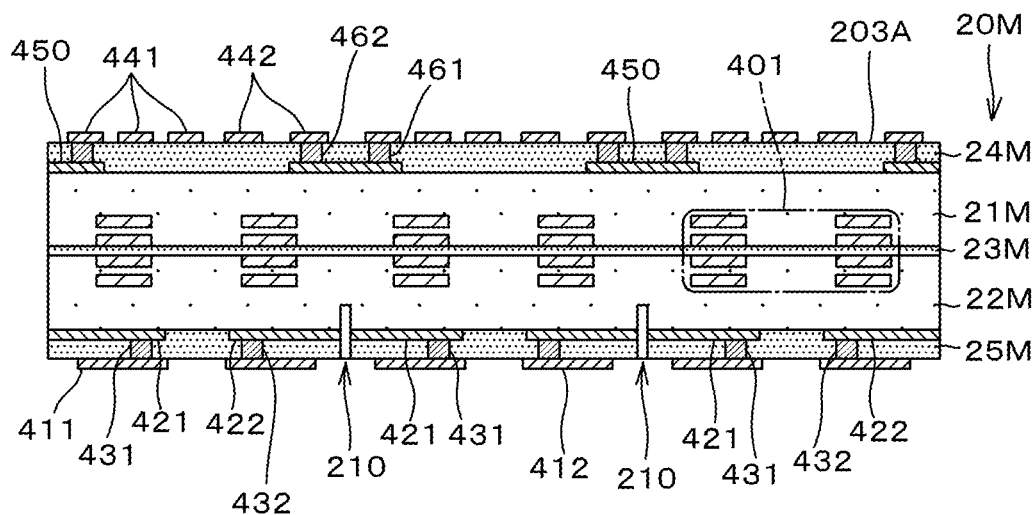

Then, as illustrated in FIG. 5B, break grooves 210 at which the mother multilayer body 20M is to be divided into the individual element sections are preferably formed. By forming the break grooves 20M, the wiring conductor 420 is divided into the third wiring conductor 421 and the fourth wiring conductor 422. Moreover, outer end portions of the third wiring conductor 421 and the fourth wiring conductor 422 are exposed to the break grooves 210.

Figure 5C:
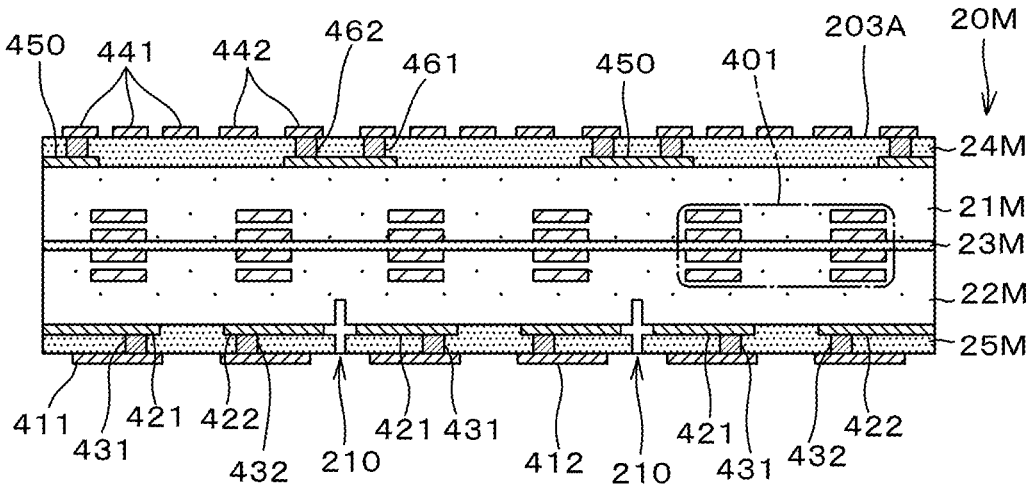

Thereafter, the mother multilayer body 20M is fired. The third wiring conductor 421 and the fourth wiring conductor 422, both being metal conductors, shrink with the firing. Thus, as illustrated in FIG. 5C, a position of the outer end surface of the third wiring conductor 421 is located on the inner side than positions of an end surface of the magnetic layer 22M and an end surface of the nonmagnetic layer 25M, those end surfaces being exposed to the break grooves 210. Similarly, a position of the outer end surface of the fourth wiring conductor 422 is located on the inner side than positions of an end surface of the magnetic layer 22M and an end surface of the nonmagnetic layer 25M, those end surfaces being exposed to the break grooves 210.

Then, plating films are preferably formed over the outer end surfaces of the third wiring conductor 421 and the fourth wiring conductor 422. At that time, plating deposition progresses toward the magnetic layer 22M having the lower resistivity than the nonmagnetic layer 25M. Thus, as illustrated in FIG. 6A, the plating films 81 and 82 are each formed in a state extending out in a direction covering the magnetic layer 22M by a larger distance than in a direction covering the nonmagnetic layer 25M.

Thereafter, as illustrated in FIG. 6B, the first mounted electronic component 51 and the second mounted electronic component 52 are mounted to a first principal surface 203A of the mother multilayer body 20M after being fired. More specifically, the first mounted electronic component 51 is mounted to the first component-mounting land conductor 441, and the second mounted electronic component 52 is mounted to the second component-mounting land conductor 442.

Subsequently, as illustrated in FIG. 6B, a sealing resin 30M is preferably formed on the side covering the first principal surface 203A of the mother multilayer body 20M. Then, the mother multilayer body 20M is divided along the break grooves 210 into the individual element sections. Finally, the outer conductor 60 is formed on the outer side of each of the individual element sections. The outer conductor 60 may preferably be formed by a sputtering method, for example.

The present invention is not limited to the above-described preferred embodiments, and various applications and modifications can be conceived in implementing the present invention within the scope not departing from the gist of the present invention.

For instance, while the end surface 422a of the fourth wiring conductor 422 has been described as being positioned on the inner side than the end surface 22a of the second magnetic layer 22 and the end surface 25a of the second nonmagnetic layer 25, the end surface 422a may be positioned at the same or substantially the same position as the end surface 22a of the second magnetic layer 22 and the end surface 25a of the second nonmagnetic layer 25 when viewed in the thickness direction. Similarly, while the end surface of the third wiring conductor 421 has been described as being positioned more inwardly than the end surface of the second magnetic layer 22 and the end surface of the second nonmagnetic layer 25, it may be positioned at the same or substantially the same position as the latter end surfaces when viewed in the thickness direction. In other words, the predetermined end surface of the metal conductor in the present invention is just required to be positioned at least near the end surface of the ferrite substrate 20, i.e., the multilayer body.

While the above preferred embodiments have been described in connection with an example in which the ferrite substrate module 10 is used as the step-down DC-DC converter, the ferrite substrate module 10 may be used as a step-up DC-DC converter or a step-down and step-up DC-DC converter each of which includes at least the inductor 73 and the control IC 71.

The above-described ferrite substrate module 10 may be implemented in a structure not including the first mounted electronic component 51 and the second mounted electronic component 52.

The above preferred embodiments have been described in connection with an example in which the electronic component is the ferrite substrate module 10, and in which the second magnetic layer 22 of the ferrite substrate module 10 corresponds to the first insulator and the second nonmagnetic layer 25 corresponds to the second insulator. However, the electronic component according to preferred embodiments of the present invention is not limited to the ferrite substrate module. Moreover, the first insulator is not limited to the magnetic layer, and the second insulator is not limited to the nonmagnetic layer.

In short, the electronic component according to preferred embodiments of the present invention is just required to include a multilayer body including a first insulator and a second insulator having a higher resistivity than the first insulator, a metal conductor positioned between the first insulator and the second insulator and having a predetermined end surface positioned at least near an end surface of the multilayer body, a plating film provided on the predetermined end surface of the metal conductor in a state extending out in a direction covering an end surface of the first insulator by a larger distance than in a direction covering an end surface of the second insulator, and an outer conductor provided on the outer side of the plating film and electrically connected to the metal conductor through the plating film.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
    a multilayer body including a first insulator and a second insulator having a higher resistivity than the first insulator;
    a metal conductor positioned between the first insulator and the second insulator and including a predetermined end surface positioned at least near an end surface of the multilayer body;
    a plating film provided on the predetermined end surface of the metal conductor in a state extending out in a direction covering an end surface of the first insulator by a larger distance than in a direction covering an end surface of the second insulator; and
    an outer conductor provided on an outer side of the plating film and electrically connected to the metal conductor through the plating film.

2. The electronic component according to claim 1, wherein the predetermined end surface of the metal conductor is positioned on an inner side that is inward from the end surface of the multilayer body.

3. The electronic component according to claim 1, wherein the first insulator is a magnetic body and the second insulator is a nonmagnetic body.

4. The electronic component according to claim 1, wherein
    a coil is provided inside the first insulator; and
    the outer conductor defines and functions as a shield.

5. The electronic component according to claim 1, wherein the metal conductor is electrically connected to a ground.

6. The electronic component according to claim 4, wherein the coil is provided as a spiral conductor including an opening defined at a center of the multilayer body when viewed in plan and having an axial direction aligned with a thickness direction of the multilayer body.

7. The electronic component according to claim 6, wherein portions of the spiral conductor are embedded within both of the first insulator and the second insulator.

8. The electronic component according to claim 1, further comprising:
    a first nonmagnetic layer provided on a surface of the first insulator; and
    a second nonmagnetic layer provided on a surface of the second insulator.

9. The electronic component according to claim 8, wherein a first component-mounting land conductor and a second component-mounting land conductor are provided on a principal surface of the first nonmagnetic layer.

10. The electronic component according to claim 9, further comprising:
    a first wiring conductor and a second wiring conductor provided at an interface between the first nonmagnetic layer and the first insulator; wherein
    the first wiring conductor is electrically connected to the first component-mounting land conductor through a first interlayer connection conductor, and the second wiring conductor is electrically connected to the second component-mounting land conductor through a second interlayer connection conductor.

11. The electronic component according to claim 10, wherein
    a first terminal conductor and a second terminal conductor are provided on a principal surface of the second nonmagnetic layer;

a third wiring conductor and the metal conductor are provided at an interface between the second nonmagnetic layer and the second insulator; and the third wiring conductor is electrically connected to the first terminal conductor through a third interlayer connection conductor and the metal conductor is electrically connected to the second terminal conductor through a fourth interlayer connection conductor.

12. The electronic component according to claim 9, wherein a first mounted electronic component is electrically connected to the first component-mounting land conductor and a second mounted electronic component is electrically connected to the second component-mounting land conductor.

13. The electronic component according to claim 12, wherein the first mounted electronic component, the second mounted electronic component, and the principal surface of the first nonmagnetic layer are covered with a sealing resin.

14. The electronic component according to claim 13, wherein the outer conductor covers a surface of the sealing resin and lateral surfaces of the multilayer body.

15. The electronic component according to claim 1, wherein the outer conductor includes three layers of stainless steel, copper, and stainless steel.

16. The electronic component according to claim 11, wherein the first wiring conductor, the second wiring conductor, the third wiring conductor, and the metal conductor are all electrically connected to the outer conductor.

17. The electronic component according to claim 16, wherein the first wiring conductor, the second wiring conductor, the third wiring conductor, and the metal conductor are made from a material with Ag as a main ingredient.

18. The electronic component according to claim 16, wherein the first mounted electronic component is a control IC and the second mounted electronic component includes capacitors.

19. The electronic component according to claim 1, wherein a total area where the plating film covers the first insulator is larger than a total area of connection between the plating film and the second insulator.

20. The electronic component according to claim 1, wherein a width of the metal conductor perpendicular or substantially perpendicular to the direction covering an end surface of the first insulator and the direction covering an end surface of the second insulator is shorter than a width of the plating film perpendicular or substantially perpendicular to the direction covering an end surface of the first insulator and the direction covering an end surface of the second insulator.

* * * * *